(12) United States Patent
Schneider et al.

(10) Patent No.: US 9,332,632 B2
(45) Date of Patent: May 3, 2016

(54) GRAPHENE-BASED THERMAL MANAGEMENT CORES AND SYSTEMS AND METHODS FOR CONSTRUCTING PRINTED WIRING BOARDS

(71) Applicant: Stablcor Technology, Inc., Huntington Beach, CA (US)

(72) Inventors: Douglas Schneider, Huntington Beach, CA (US); William E. Davis, Huntington Beach, CA (US)

(73) Assignee: Stablcor Technology, Inc., Huntington Beach, CA (US)

(*) Notice: Subject to any disclaimer, the term of this patent is extended or adjusted under 35 U.S.C. 154(b) by 0 days.

(21) Appl. No.: 14/464,656

(22) Filed: Aug. 20, 2014

(65) Prior Publication Data

US 2016/0057854 A1    Feb. 25, 2016

(51) Int. Cl.
| | |
|---|---|
| H01L 23/12 | (2006.01) |
| H01L 23/053 | (2006.01) |
| H05K 1/02 | (2006.01) |
| H05K 1/11 | (2006.01) |
| H05K 1/03 | (2006.01) |
| B32B 9/00 | (2006.01) |
| B32B 5/16 | (2006.01) |
| F28F 21/02 | (2006.01) |
| F28F 21/08 | (2006.01) |

(52) U.S. Cl.
CPC ............. *H05K 1/0271* (2013.01); *B32B 5/16* (2013.01); *B32B 9/007* (2013.01); *F28F 21/02* (2013.01); *F28F 21/089* (2013.01); *H05K 1/0203* (2013.01); *H05K 1/0298* (2013.01); *H05K 1/0306* (2013.01); *H05K 1/115* (2013.01); *B32B 2307/302* (2013.01); *B32B 2457/08* (2013.01)

(58) Field of Classification Search
None
See application file for complete search history.

(56) References Cited

U.S. PATENT DOCUMENTS

| | | | |
|---|---|---|---|
| 4,299,873 | A | 11/1981 | Ogihara et al. |
| 4,318,954 | A | 3/1982 | Jensen |
| 4,495,378 | A | 1/1985 | Dotzer et al. |
| 4,568,971 | A | 2/1986 | Alzmann et al. |
| 4,591,659 | A | 5/1986 | Leibowitz |
| 4,604,319 | A | 8/1986 | Evans et al. |

(Continued)

FOREIGN PATENT DOCUMENTS

| | | |
|---|---|---|
| CA | 2014892 A1 | 10/1990 |
| CN | 87107023 A | 4/1988 |

(Continued)

OTHER PUBLICATIONS

CTE Matched MLB, Dyconex—Technologies & Products—Products—CTE Matched MLB, Oct. 4, 1997, printout from dyconex.com website, 3 pages.

(Continued)

*Primary Examiner* — Angel Roman
(74) *Attorney, Agent, or Firm* — KPPB LLP

(57) ABSTRACT

Systems and methods in accordance with embodiments of the invention implement graphene-based thermal management cores and printed wiring boards incorporating graphene-based thermal management cores. In one embodiment, a graphene-based thermal management core includes: a layer including at least one sheet of graphene; a first reinforcement layer; and a second reinforcement layer; where the layer including at least one sheet of graphene is disposed between the first reinforcement layer and the second reinforcement layer.

21 Claims, 11 Drawing Sheets

(56) References Cited

U.S. PATENT DOCUMENTS

| | | |
|---|---|---|
| 4,609,586 A | 9/1986 | Jensen et al. |
| 4,656,559 A | 4/1987 | Fathi |
| 4,664,768 A | 5/1987 | Scala et al. |
| 4,680,079 A | 7/1987 | Tanaka |
| 4,689,110 A | 8/1987 | Leibowitz |
| 4,711,804 A | 12/1987 | Burgess |
| 4,747,897 A | 5/1988 | Johnson |
| 4,769,270 A | 9/1988 | Nagamatsu et al. |
| 4,792,646 A | 12/1988 | Enomoto |
| 4,812,792 A | 3/1989 | Leibowitz |
| 4,878,152 A | 10/1989 | Sauzade et al. |
| 4,882,454 A | 11/1989 | Peterson et al. |
| 4,888,247 A | 12/1989 | Zweben et al. |
| 5,004,639 A | 4/1991 | Desai |
| 5,036,428 A | 7/1991 | Brownhill et al. |
| 5,217,657 A | 6/1993 | Engle |
| 5,250,363 A | 10/1993 | Chen |
| 5,304,743 A | 4/1994 | Sen et al. |
| 5,326,636 A | 7/1994 | Durand et al. |
| 5,354,599 A | 10/1994 | McClanahan et al. |
| 5,382,505 A | 1/1995 | Schmidt et al. |
| 5,436,062 A | 7/1995 | Schmidt et al. |
| 5,461,201 A | 10/1995 | Schonberger et al. |
| 5,509,200 A | 4/1996 | Frankeny et al. |
| 5,527,838 A | 6/1996 | Afzali-Ardakani et al. |
| 5,533,841 A | 7/1996 | Iwano et al. |
| 5,646,373 A | 7/1997 | Collins et al. |
| 5,672,433 A | 9/1997 | Cook |
| 5,746,929 A | 5/1998 | Schmidt et al. |
| 5,819,401 A | 10/1998 | Johannes et al. |
| 5,824,177 A | 10/1998 | Yoshihara et al. |
| 5,861,666 A | 1/1999 | Bellaar |
| 6,013,588 A | 1/2000 | Ozaki |
| 6,016,598 A | 1/2000 | Middelman et al. |
| 6,054,337 A | 4/2000 | Solberg |
| 6,068,782 A | 5/2000 | Brandt et al. |
| 6,147,401 A | 11/2000 | Solberg |
| 6,207,904 B1 | 3/2001 | Kramer et al. |
| 6,211,487 B1 | 4/2001 | Hatakeyama et al. |
| 6,212,071 B1 | 4/2001 | Roessler et al. |
| 6,214,640 B1 | 4/2001 | Fosberry et al. |
| 6,222,740 B1 | 4/2001 | Bovensiepen et al. |
| 6,225,688 B1 | 5/2001 | Kim et al. |
| 6,232,152 B1 | 5/2001 | DiStefano et al. |
| 6,313,528 B1 | 11/2001 | Solberg |
| 6,323,439 B1 | 11/2001 | Kambe et al. |
| 6,323,539 B1 | 11/2001 | Fujihira et al. |
| 6,329,603 B1 | 12/2001 | Japp et al. |
| 6,340,796 B1 | 1/2002 | Smith et al. |
| 6,341,067 B1 | 1/2002 | Conder |
| 6,373,000 B2 | 4/2002 | Nakamura et al. |
| 6,400,008 B1 | 6/2002 | Farnworth |
| 6,400,010 B1 | 6/2002 | Murata |
| 6,400,576 B1 | 6/2002 | Davidson |
| 6,426,470 B1 | 7/2002 | Farquhar et al. |
| 6,448,509 B1 | 9/2002 | Huemoeller |
| 6,459,047 B1 | 10/2002 | Japp et al. |
| 6,479,136 B1 | 11/2002 | Nakanishi |
| 6,486,394 B1 | 11/2002 | Schmidt et al. |
| 6,541,865 B2 | 4/2003 | Hawker et al. |
| 6,597,583 B1 | 7/2003 | Sasaki |
| 6,613,313 B2 | 9/2003 | Kimura |
| 6,613,413 B1 | 9/2003 | Japp et al. |
| 6,639,155 B1 | 10/2003 | Bupp et al. |
| 6,700,078 B2 | 3/2004 | Farquhar et al. |
| 6,711,812 B1 | 3/2004 | Lu et al. |
| 6,722,031 B2 | 4/2004 | Japp et al. |
| 6,766,576 B2 | 7/2004 | Haze et al. |
| 6,794,748 B1 | 9/2004 | Chiu |
| 6,820,332 B2 | 11/2004 | Japp et al. |
| 6,844,504 B2 | 1/2005 | Wang et al. |
| 6,869,664 B2 | 3/2005 | Vasoya et al. |
| 6,869,665 B2 | 3/2005 | Tani et al. |
| 6,920,624 B2 | 7/2005 | Garrepally et al. |
| 6,938,227 B2 | 8/2005 | Murphy et al. |
| 6,996,903 B2 | 2/2006 | Farquhar et al. |
| 7,002,080 B2 | 2/2006 | Tani et al. |
| 7,038,142 B2 | 5/2006 | Abe |
| 7,047,628 B2 | 5/2006 | Lee |
| 7,050,303 B2 | 5/2006 | Park et al. |
| 7,301,105 B2 | 11/2007 | Vasoya |
| 7,378,602 B2 | 5/2008 | Ikeda |
| 7,388,157 B2 | 6/2008 | Abe et al. |
| 7,635,815 B2 | 12/2009 | Vasoya et al. |
| 7,667,142 B2 | 2/2010 | Vasoya et al. |
| 8,097,335 B2 | 1/2012 | Vasoya et al. |
| 8,203,080 B2 | 6/2012 | Vasoya |
| RE45,637 E | 7/2015 | Vasoya |
| 2001/0010250 A1 | 8/2001 | Kobayashi et al. |
| 2002/0085360 A1 | 7/2002 | Doi |
| 2002/0157859 A1 | 10/2002 | Vasoya et al. |
| 2003/0029850 A1 | 2/2003 | Varriano-Marston |
| 2003/0136577 A1 | 7/2003 | Abe |
| 2003/0196749 A1 | 10/2003 | Japp et al. |
| 2004/0020673 A1 | 2/2004 | Mazurkiewicz |
| 2004/0099364 A1 | 5/2004 | Suzuki et al. |
| 2004/0107569 A1 | 6/2004 | Guzek et al. |
| 2004/0118602 A1 | 6/2004 | Lee et al. |
| 2004/0130877 A1 | 7/2004 | Okubora |
| 2004/0151882 A1 | 8/2004 | Tani et al. |
| 2004/0163248 A1 | 8/2004 | Lu et al. |
| 2004/0165361 A1 | 8/2004 | Kimura et al. |
| 2004/0238209 A1 | 12/2004 | Yuri et al. |
| 2004/0262036 A1 | 12/2004 | Brist et al. |
| 2005/0016763 A1 | 1/2005 | Zollo et al. |
| 2005/0257957 A1 | 11/2005 | Vasoya |
| 2006/0002092 A1 | 1/2006 | Stevens |
| 2006/0063428 A1 | 3/2006 | Vasoya et al. |
| 2006/0231198 A1 | 10/2006 | Vasoya |
| 2007/0013049 A1 | 1/2007 | Asai et al. |
| 2007/0215381 A1 | 9/2007 | Vasoya et al. |
| 2008/0014336 A1 | 1/2008 | Asai et al. |
| 2008/0023815 A1 | 1/2008 | Asai et al. |
| 2009/0090465 A1 | 4/2009 | Vasoya et al. |
| 2010/0085713 A1* | 4/2010 | Balandin et al. ............... 361/705 |
| 2010/0128439 A1* | 5/2010 | Tilak et al. .................... 361/709 |
| 2010/0319969 A1 | 12/2010 | Vasoya et al. |
| 2012/0074430 A1* | 3/2012 | Lee et al. ......................... 257/79 |
| 2012/0077039 A1* | 3/2012 | Lee et al. ....................... 428/413 |
| 2012/0097431 A1 | 4/2012 | Vasoya et al. |
| 2012/0193785 A1* | 8/2012 | Lin et al. ........................ 257/737 |
| 2012/0241202 A1 | 9/2012 | Vasoya |
| 2012/0288762 A1 | 11/2012 | Hardin |
| 2014/0027161 A1* | 1/2014 | Lee ................................. 174/257 |
| 2014/0218867 A1* | 8/2014 | Kim et al. ...................... 361/704 |
| 2015/0109719 A1* | 4/2015 | Yun et al. ....................... 361/502 |

FOREIGN PATENT DOCUMENTS

| | | |
|---|---|---|
| CN | 1269538 A | 10/2000 |
| EP | 0313961 A2 | 5/1989 |
| EP | 1821586 A1 | 8/2007 |
| GB | 2248725 A | 4/1992 |
| JP | 62086888 A | 4/1987 |
| JP | 62181128 A | 8/1987 |
| JP | 63311796 A | 12/1988 |
| JP | 4024998 A | 1/1992 |
| JP | 05045079 Y2 | 11/1993 |
| JP | 07001828 B2 | 1/1995 |
| JP | 7249847 A | 9/1995 |
| JP | 8083981 A | 3/1996 |
| JP | 11040902 A | 2/1999 |
| JP | 11163538 A | 6/1999 |
| JP | 11186734 A | 7/1999 |
| JP | 2000323840 A | 11/2000 |
| JP | 2003243831 A | 8/2003 |
| JP | 2003273482 A | 9/2003 |
| JP | 2004355203 A | 12/2004 |
| JP | 2006019451 A | 1/2006 |
| KR | 1020080100483 A | 11/2008 |
| KR | 1020120032871 A | 4/2012 |
| TW | I246369 B | 12/2005 |
| WO | 9502505 A1 | 1/1995 |
| WO | 9717199 A1 | 5/1997 |

(56) References Cited

FOREIGN PATENT DOCUMENTS

| WO | 0247899 | A1 | 6/2002 |
|---|---|---|---|
| WO | 2005022965 | A2 | 3/2005 |
| WO | 2005117508 | A2 | 12/2005 |
| WO | 2005117508 | A3 | 12/2005 |
| WO | 2006024009 | A2 | 3/2006 |
| WO | 2006026566 | A1 | 3/2006 |
| WO | 2006099554 | A2 | 9/2006 |
| WO | 2005022965 | A3 | 2/2007 |
| WO | 2006024009 | A3 | 6/2007 |
| WO | 2007103949 | A2 | 9/2007 |
| WO | 2008008552 | A2 | 1/2008 |
| WO | 2007103949 | A3 | 6/2008 |
| WO | 2008008552 | A3 | 1/2009 |
| WO | 2006099554 | A3 | 4/2009 |

OTHER PUBLICATIONS

"High-Performance DYCOstrate MLBs", Dyconex Advanced Circuit Technology, pp. 1-11.

"Thermal Management of Electronics", The 5th International Bureau and Technology Summit, Aug. 17-18, 2005, Natick, MA, Show brochure and documents, 348 pages.

Dietz, Karl, "Fine Lines in High Yield (Part LXXX): Problems with Residual, Excess Copper in Print/Etch and Tent/Etch Processes (Part C)", Tech Talk, 2005, printout from Circuitree website by BNP Media, 5 pages.

International Search Report for International Application No. PCT/US2005/030709, International Filing Date Aug. 29, 2005, Report Completed Jan. 11, 2006, Mailed Jan. 119, 2006, 2 pages.

International Search Report for International Application No. PCT/US06/09597, Report completed Jan. 8, 2008, Report mailed May 21, 2008, 4 pages.

International Search Report for International Application No. PCT/US2004/028246 filed Aug. 30, 2004, report completed Feb. 8, 2006, mailed Dec. 15, 2006, 3 pages.

International Search Report for International Application No. PCT/US2005/017150, International Filing Date May 16, 2005, Search completed Jan. 10, 2007, mailed Mar. 5, 2007, 4 pages.

International Search Report for International Application No. PCT/US2005/030277, International Filing Date Aug. 24, 2005, Report complete Mar. 27, 2007, mailed May 2, 2007, 3 pages.

International Search Report for International Application PCT/US2007/016210, International Filing Date Jul. 16, 2007, Report completed Jun. 3, 2008, mailed Oct. 15, 2008, 4 pages.

International Search Report for International Application PCT/US2007/063429, International Filing Date Mar. 6, 2007, report completed Sep. 3, 2007, mailed Mar. 14, 2008, 2 pages.

Meier, Dieter J. et al., "Laser Structuring of Fine Lines", posted Sep. 1, 2000, 7 pages.

Supplemental European Search Report dated Feb. 11, 2010 from corresponding European Application No. EP 05 76 3696, 3 pages.

Supplemental European Search Report dated Apr. 30, 2004 from corresponding European Application No. EP 01 99 0176, 2 pages.

Written Opinion dated Jan. 11, 2006 mailed Jan. 19, 2006 for Application No. PCT/US2005/030709 filed Aug. 29, 2005, 3 pages.

Written Opinion for International Application No. PCT/US2004/028246 filed Aug. 30, 2004, report completed Aug. 23, 2006, mailed Dec. 15, 2006, 3 pages.

Written Opinion for International Application No. PCT/US2005/017150, International filing Date May 16, 2005, Opinion completed Jan. 10, 2007, mailed Mar. 5, 2007, 6 pages.

Written Opinion for International Application No. PCT/US2005/030277, International Filing Date Aug. 24, 2005, Report complete Mar. 27, 2007, Mailed May 2, 2007, 3 pages.

Written Opinion for International Application PCT/US2007/016210, International Filing Date Jul. 16, 2007, Report completed Jun. 3, 2008, mailed Oct. 15, 2008, 3 pages.

Written Opinion for International Application No. PCT/US2007/063429, International Filing Date Mar. 6, 2007, report completed Sep. 3, 2007, mailed Mar. 14, 2008, 5 pages.

Written Opinion for International Application No. PCT/US06/09597, Report completed Jan. 8, 2008, Mailed May 21, 2008, 7 pages.

Rellick, Gerald, Carbon and Graphite Matrices in Carbon-Carbon Composites: an Overview of their Formation, Structure, and Properties, Oct. 1992, Retrieved from: https://web.anl.gov/PCS/acsfuel/preprint%20archive/Files/36_3_NEW%20YORK_08-91_1094.pdf, 16 pages.

Spitz, S. L., "Specialty Laminates Fill Special Needs", Electronic Packaging and Production, Cahners Publishing Co, Newton, MASS., US, vol. 29, No. 2, Feb. 1, 1989, pp. 108-111.

* cited by examiner

GRAPHENE-BASED THERMAL MANAGEMENT CORES AND SYSTEMS AND METHODS FOR CONSTRUCTING PRINTED WIRING BOARDS

FIELD OF THE INVENTION

The present invention generally relates to printed wiring board cores and more specifically the incorporation of graphene in printed wiring boards.

BACKGROUND

Printed wiring boards (PWBs), also referred to as printed circuit boards (PCBs), are ubiquitous in a variety of electronics applications, such as consumer electronics, industry electronics, military electronics, automotive electronics and medical electronics. Generally, printed wiring boards function to provide mechanical support and electrical connections for mounted electronic components. A typical printed wiring board can be considered as a layered structure including conductive portions that can enable electrical interconnections and nonconductive portions, e.g. dielectric 'pre-pregs.' For example, the conductive portions can be implemented with patterned layers of electrically conductive material. The electrically conductive layers are usually made of copper foils and patterned to provide electrical paths for connecting the electronic devices mounted on the board. The dielectric layers typically separate the electrically conductive layers and thereby help form the desired circuit patterns. The dielectric layers also typically contribute greatly to the board's thickness and rigidity. In many instances, a printed wiring board is multi-layered and includes a constraining core that generally functions to mechanically support the other layers of the printed wiring board and otherwise provide structural rigidity. The constraining core can also play a significant role in distributing and managing heat loads generated by mounted electronic components. In many instances, printed wiring boards include vias, which establish electrical connections between different layers of conductive materials within a printed wiring board.

SUMMARY OF THE INVENTION

Systems and methods in accordance with embodiments of the invention implement graphene-based thermal management cores and printed wiring boards incorporating graphene-based thermal management cores. In one embodiment, a graphene-based thermal management core includes: a layer including at least one sheet of graphene; a first reinforcement layer; and a second reinforcement layer; where the layer including at least one sheet of graphene is disposed between the first reinforcement layer and the second reinforcement layer.

In another embodiment, the at least one sheet of graphene is implemented via at least one graphene nanoplatelet.

In yet another embodiment, the layer including at least one sheet of graphene includes a plurality of graphene nanoplatelets.

In still another embodiment, at least two of the plurality of graphene nanoplatelets have a thickness of between approximately 1 nm and approximately 20 nm.

In still yet another embodiment, at least two of the plurality of graphene nanoplatelets have a width between approximately 1 micron and approximately 50 microns.

In a further embodiment, at least two of the plurality of graphene nanoplatelets are characterized by a thermal conductivity of between approximately 500 W/mK and approximately 2,500 W/mK.

In a still further embodiment, at least either the first reinforcement layer or the second reinforcement layer includes a substrate impregnated with resin.

In a yet further embodiment, the resin is dielectric.

In a still yet further embodiment, the resin is non-dieletric.

In another embodiment, the resin is one of: Stablcor® EP-01, a phenolic based resin, a Bismaleimide Triazine (BT) epoxy based resin, a Cyanate Ester based resin, and a polyimide based resin.

In yet another embodiment, the substrate includes carbon.

In still another embodiment, the substrate includes one of: carbon fibers, carbon plates, carbon flakes, and mixtures thereof.

In still yet another embodiment, the substrate includes carbon fibers that include graphite.

In a further embodiment, the carbon fibers are unidirectional.

In a still further embodiment, the carbon fibers are woven.

In a yet further embodiment, at least either the first reinforcement layer or the second reinforcement layer includes one of: ST10-Epoxy, ST10 Polyimide, ST325-Epoxy, and mixtures thereof.

In a still yet further embodiment, a graphene-based management core further includes: a first electrically conductive layer bound to the first reinforcement layer; and a second electrically conductive layer bound to the second reinforcement layer.

In another embodiment, at least one of the first electrically conductive layer and second electrically conductive layer includes copper.

In yet another embodiment, a printed wiring board includes: a graphene-based thermal management core that itself includes: a layer including at least one sheet of graphene; a first reinforcement layer; and a second reinforcement layer; where the layer including at least one sheet of graphene is disposed between the first reinforcement layer and the second reinforcement layer; at least one dielectric layer; and at least one electrically conductive layer that includes a circuit trace; where at least one dielectric layer is disposed between the graphene-based thermal management core and at least one electrically conductive layer.

In still another embodiment, the graphene-based thermal management core is electrically isolated from any circuit traces.

In still yet another embodiment, the graphene-based thermal management core is electrically connected to at least one circuit trace.

In a further embodiment, the graphene-based thermal management core is electrically connected to the circuit trace by a via.

In a yet further embodiment, the graphene-based thermal management core is configured to act as one of: a ground plane; a power plane; and a split power and ground plane.

In a still further embodiment, the layer including at least one sheet of graphene includes at least one graphene nanoplatelet.

In a still yet further embodiment, at least either the first reinforcement layer or the second reinforcement layer includes a substrate impregnated with resin.

In another embodiment, the substrate includes carbon.

In yet another embodiment, at least either the first reinforcement layer or the second reinforcement layer includes one of: ST10-Epoxy, ST10 Polyimide, ST325-Epoxy, and mixtures thereof.

DETAILED DESCRIPTION

Figure 1:
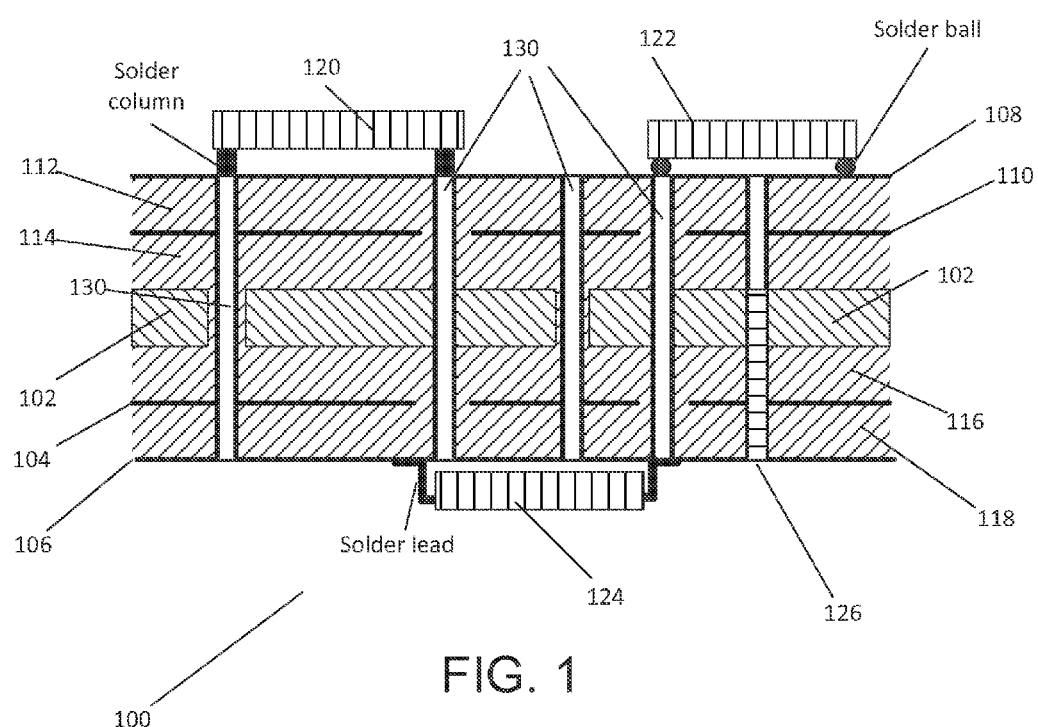
FIG. 1 is a schematic cross-sectional view of a PWB that includes a graphene-based thermal management core that is electrically connected to other electrically conductive layers within the PWB in accordance with an embodiment of the invention.

Turning now to the drawings, graphene-based thermal management cores for use in printed wiring boards in accordance with embodiments of the invention are illustrated. Some of the factors that are of principal consideration when designing printed wiring boards include thermal management, affordability, rigidity, and weight. Indeed, thermal management is a chief consideration in the design of PWBs. In particular, the overall push to decrease the circuit size and weight of electronic components and to develop them so that they can operate at higher frequencies and clock speeds has led to the development of relatively smaller electronic components that, although provide greater overall efficacy, can generate significant heat during operation. Moreover, in many instances, these electronic components are often coupled to printed wiring boards using surface mount technology packages that can allow the PWB to be more densely populated with these heat-generating electronic components. Accordingly, a suitable printed wiring board must be able to withstand such significant heat generation.

For example, a PWB should be designed such that the coefficient of thermal expansion (CTE) of the PWB's constituent materials and the mounted components should not be such that the mounted components and the materials within the board are excessively stressed during normal operation (e.g. such that a stress fracture or other such failure results). This can be achieved, for example, by implementing materials having sufficiently similar coefficients of thermal expansion. Leadless chip carriers, solder joints, embedded ICs, and other connections may be particularly susceptible to a CTE 'mismatch' that can cause the bonds to sever. In addition to avoiding such stress fractures, it is also desirable to avoid the fatiguing of the materials, which can be caused for example by thermal cycling, which itself can be a result of the powering on and off of mounted electronic components.

Prior PWB designs have used metal constraining layers or cores, such as copper-invar-copper, aluminum, or steel, to lower the board's overall CTE and thereby mitigate the above-mentioned problems. These metal cores are used to anchor the layers within the PWB and also dissipate generated heat, thereby aiding in the reduction of instances of excessive thermal expansion. However, the incorporation of such cores into PWBs can be disadvantageous. For example, these metal cores can require special processing in order to be incorporated into PWB structures and usually increase the weight of boards and the cost of material and labor.

Alternatives to metal thermal management cores have also been implemented. For example, PWB designs that include cores having carbon materials have been disclosed. For instance, U.S. Pat. Pub. No. US 2005/0257957 and U.S. Pat. Nos. 6,869,664, 7,730,613, and 8,203,080 to Vasoya et al. disclose using carbon fibers and/or carbon plates within PWBs and the advantages of implementing such configurations. The disclosures of U.S. patent application Ser. No. 11/131,130 and U.S. Pat. Nos. 6,869,664, 7,730,613, and 8,203,080 are hereby incorporated by reference.

Graphene is a particularly unique form of carbon that can possess a number of desirable properties. Graphene can be characterized as a one atom thick, nearly transparent sheet of carbon; the carbon atoms in graphene are densely packed in a regular two-dimensional hexagonal pattern. It is generally understood that this atomic structure of graphene enables it to conduct heat and electricity with great efficiency. For example, the thermal conductivity of a single graphene layer has been measured to be between approximately 4840±440 W/mK and approximately 5300±480 W/mK. By contrast, the thermal conductivity of copper has been measured to be approximately 384 W/mK, and the thermal conductivity of aluminum has been measured to be approximately 180 W/mK. In effect, graphene can dissipate heat more efficiently than copper or aluminum. Moreover, whereas most materials, including those typically used in conventional PWBs and electronic components, generally expand with an increase in temperature (i.e. they exhibit a positive CTE), graphene can shrink with an increase in temperature—i.e. it can exhibit a negative CTE.

Accordingly, in many embodiments of the invention, graphene-based thermal management cores that include at least one sheet of graphene are implemented for use within PWBs. In this way, PWBs can harness the advantageous materials properties that graphene exhibits—e.g. its thermal conductivity and electrical conductivity. In a number of embodiments, a graphene-based thermal management core includes a layer including at least one sheet of graphene disposed between reinforcement layers that confer desirable structural properties to the graphene-based thermal management core. Thus, generally, the reinforcement layers can imbue the constraining core with robust structural properties, and the layer including the at least one graphene sheet can provide advantageous thermal and electrical properties. In some embodiments, the layer including the at least one sheet of graphene is disposed proximate to a single reinforcement layer, and is bounded on an opposing side by an electrically conductive layer, e.g. a copper foil.

In many embodiments, graphene-based thermal management cores include a layer including at least one sheet of graphene disposed between layers including carbon composites to form graphene-based carbon composite thermal management cores. In such configurations, the layers including carbon composites can provide the constraining core with robust structural properties, and the at least one sheet of graphene can greatly facilitate the dissipation of generated heat. For example, in many embodiments, the layers including carbon composites can provide desired rigidity and stiffness to the core. As can readily be appreciated, a core with sufficient rigidity and stiffness can more easily withstand rigorous operating conditions. Moreover, a graphene-based thermal management core that is made to be sufficiently rigid and stiff can also be advantageous insofar as the rigidity and stiffness can allow it to more easily withstand manufacturing processes, e.g., hole drilling processes. In addition, in a number of embodiments, the layers including carbon composites are also characterized by low coefficients of thermal expansion, high thermal conductivity, and a low density. Importantly, these configurations can be implemented relatively cost effectively in comparison to conventional metal cores.

In several embodiments, a graphene-based thermal management core is electrically connected to at least some of the electrically conductive paths within a printed wiring board. For example, the two reinforcement layers that provide desirable structural properties, and the layer including the at least one sheet of graphene can be made to be electrically conductive; in this way, the graphene-based thermal management core can be implemented within a PWB so as to function as a ground plane, a power plane, or a ground plane and power plane via a split plane configuration. In some embodiments, the graphene-based thermal management core layer is not a part of any electrical circuit within a PWB, but still functions to facilitate thermal management within the PWB. Printed wiring boards including graphene-based thermal management cores are discussed in greater detail below.

Printed Wiring Boards Including Graphene-Based Thermal Management Cores

In many embodiments of the invention, a graphene-based thermal management core is implemented within a PWB. Implementing graphene within a PWB can be advantageous in a number of respects. For example, because of the relatively high thermal conductivity and low coefficient of thermal expansion of graphene, the incorporation of graphene within a PWB can greatly facilitate thermal management within the PWB. Moreover, graphene is electrically conductive and therefore can be utilized where electrical conductivity is desired. Furthermore, graphene is a relatively less dense material compared to conventional metals such as aluminum and copper; thus, the advantages that graphene can provide can be achieved using a relatively lighter material. Although graphene possesses a number of advantageous materials properties, graphene may not have the requisite structural properties to, by itself, withstand operation within a PWB and further may not have the requisite structural properties to withstand a PWB manufacturing process. Accordingly, in many embodiments, a graphene-based thermal management core includes a layer including at least one sheet of graphene disposed between two reinforcement layers. The reinforcement layers can increase the stiffness and rigidity of the graphene-based thermal management core, and thereby enable the viable implementation of graphene within a PWB. In essence, the combination of graphene and reinforcement layers can allow the construction of graphene-based thermal management cores that can provide numerous advantages when implemented within printed wiring boards.

In many embodiments, graphene-based thermal management cores are made to be electrically conductive such that they can be electrically connected to the circuit traces within a PWB. For example, each of the reinforcement layers and the layer containing the at least one sheet of graphene can be electrically conductive in accordance with embodiments of the invention; note that graphene is inherently electrically conductive and it therefore can be implemented without negating the electrical conductivity of an otherwise electrically conductive graphene-based thermal management core. In essence, graphene-based thermal management cores can be made to be electrically conductive. Accordingly, in many embodiments, an electrically conductive graphene-based thermal management core is electrically connected to the circuit traces within a PWB via plated through holes, which can also be referred to as plated vias. In this way, a graphene-based thermal management core can be electrically connected to circuits on other layers of the PWB to one or more mounted electronic devices and thereby facilitate their respective operation. For example, in many embodiments, the graphene-based thermal management core defines a ground plane within a PWB. In a number of embodiments, the graphene-based thermal management core defines a power plane within a PWB. In several embodiments, a graphene-based thermal management cores defines a split power and ground plane. Split power and ground plane configurations are discussed in U.S. Pat. Pub. No. US 2005/0257957, the disclosure of which was incorporated by reference above. In essence, split power and ground planes can be implemented by routing a channel between the two regions—a region defining a ground plane and a region defining a power plane—and thereafter filling the channel with non-conductive resin to electrically isolate the two regions. In several embodiments, a graphene-based thermal management core is electrically insulated from all of the other electrically conductive portions within a PWB and is thereby electrically isolated from any mounted electrical components.

A cross section of a PWB including a graphene-based thermal management core that is electrically connected to electrically conductive layers in accordance with an embodiment of the invention is illustrated in FIG. 1. In particular, the PWB 100 includes a graphene-based thermal management core 102 electrically connected to a number of electrically conductive layers, 104, 106, 108 and 110, that are separated by a number of dielectric layers, 112, 114, 116 and 118. The electrically conductive layers can be understood to be layers that have been patterned so as to define electrically conductive paths, e.g. those that can facilitate electrical interconnections between mounted components—the electrically conductive paths are not depicted in the illustration. The electrically conductive layers, 104, 106, 108 and 110, can be constructed from any suitable electrically conductive material, for example, copper. In several embodiments, the electrically conductive layers can be constructed by using resin coated copper, nickel coated copper foil, nickel-gold coated copper foil, and any other material that can be used in construction of PWBs.

The dielectric layers, 112, 114, 116 and 118, can be constructed from fiber reinforced polymer. In some embodiments, the fiber can be constructed from E-glass or any other suitable material. In many embodiments, the polymer can be epoxy, cyanate ester, polyimide, Kevlar, PTFE and any other materials that can be used in construction of a dielectric layer in a PWB. Although many materials are listed above, embodiments of the invention are not restricted to the use of the specific above-listed materials; any suitable materials can be implemented.

Multiple electronic components, 120, 122 and 124, are mounted on the PWB 100 and connected to the graphene-based thermal management core through 'vias' 130 or metallized holes. Additionally, it is depicted that the PWB 100 includes an embedded electronic component 126. Embedded electronic components can be included within a PWB using any of a number of suitable techniques. For example, U.S. Pat. No. 7,286,366 to Zollo et al. discloses multilayer circuit boards with embedded components and methods for manufacturing the same. The disclosure of U.S. Pat. No. 7,286,366 is hereby incorporated by reference in its entirety. Each of the electronic components, 120, 122, and 124, includes a terminal that is electrically connected to the graphene-based thermal management core 102 through a via 130. The embedded electronic component 126 includes a terminal that is directly connected to the graphene-based thermal management core 102. In the illustrated embodiment, the graphene-based thermal management core acts as a ground plane. Additionally, it is depicted that each of the electronic components is coupled to the printed wiring board using a different packaging. Specifically, it is depicted that: a first electronic component 120 is coupled to the printed wiring board 100 using packaging that relies on solder columns to establish a connection to a printed wiring board; a second electronic component 122 is coupled to the printed wiring board 100 using packaging that relies on solder balls to establish a connection to a printed wiring board; a third electronic component 124 is coupled to the printed wiring board using packaging that relies on solder leads to establish a connection to a printed wiring board; and a fourth electronic component 126 is embedded within the printed wiring board 100. Of course it should be understood that electronic components can couple to printed wiring boards that incorporate graphene-based thermal management cores using any of a variety of packaging configurations and in any of a variety of ways in accordance with embodiments of the invention. Additionally, it should be appreciated that any of a variety of electronic components can be coupled to a printed wiring board including but not limited to transistors, capacitors, diodes, and/or any of a variety of integrated circuits.

While FIG. 1 depicts that an electrically conductive graphene-based thermal management core acts as a ground plane within a PWB, it should be clear that embodiments of the invention are not so constrained. An electrically conductive graphene-based thermal management core can be electrically coupled to circuit traces within a PWB so that it can act in any of a variety of ways in accordance with embodiments of the invention. For example, in many embodiments, a graphene-based thermal management core acts as a power plane within a PWB. In a number of embodiments, a graphene-based thermal management core acts as both a power plane and ground plane within a PWB via a split plane configuration, e.g. a configuration similar to those disclosed in U.S. Pat. Pub. No. US 2005/0257957, incorporated by reference above. In some embodiments, graphene based thermal management cores are implemented within PWBs so as to carry signals between mounted electronic components. Graphene-based thermal management cores are discussed in greater detail below.

Graphene-Based Thermal Management Cores

In many embodiments, a graphene-based thermal management core includes a layer including at least one sheet of graphene disposed between at least two reinforcement layers. The at least one sheet of graphene for use within the graphene-based thermal management core can be implemented using any suitable technique. For example, in many embodiments, the layers of graphene are made via the splitting of graphite into atomically thin sheets via mechanical, electrostatic, and/or electromagnetic forces in air, vacuum or inert environments. The splitting can be achieved by micromechanical cleavage, dry exfoliation and/or liquid-phase exfoliation. Alternatively, graphene can be constructed by chemical vapor deposition, molecular beam epitaxy, or atomic layer epitaxy. An isolated single sheet of graphene can be disposed between at least two reinforcement layers to form a graphene-based thermal management core in accordance with certain embodiments of the invention. Although several fabrication processes are mentioned, it should be clear that the layers of graphene can be fabricated using any suitable technique.

In many embodiments the at least one sheet of graphene is implemented via graphene nanoplatelets, such as xGnP® graphene nanoplatelets manufactured by XG Sciences. Graphene nanoplatelets can be understood to be ultrathin particles of graphite that can equivalently be understood to be short stacks of graphene sheets—the xGnP® graphene nanoplatelets manufactured by XG Sciences have a thickness ranging from approximately 1 to approximately 20 nanometers and a width ranging from approximately 1 to approximately 50 microns. Graphene nano-platelets which have been exfoliated and cast into films suitable for lamination within a printed wiring board can attain thermal conductivity ranges of between approximately 500-2,500 W/mK. In many instances the implemented graphene nanoplatelets are substantially free of oxidation. The graphene nanoplatelets can be affixed between two reinforcement layers using e.g. resin. While graphene nanoplatelets are discussed, at least one sheet of graphene can be implemented in graphene-based thermal management cores in any suitable way in accordance with embodiments of the invention. For example, in some embodiments, a single sheet of graphene is disposed in between reinforcement layers, and in a number of embodiments, the at least one sheet of graphene is in the form of graphite. For example, in some embodiments, a graphene-based thermal management core includes multiple sheets of graphene that are bonded to each other and thereby define a sheet of graphite.

By themselves, the layer including the at least one sheet of graphene may not have the requisite mechanical properties to withstand typical PWB operation. Accordingly, in many embodiments, the layer including the at least one sheet of graphene is disposed between reinforcement layers to form the graphene-based thermal management core. This structure—i.e. the layer including the at least one sheet of graphene disposed between two reinforcement layers—can be affixed using any suitable technique. For instance, the structure can be affixed via lamination. The reinforcement layers can provide the graphene-based thermal management core with enhanced rigidity and stiffness such that it can more easily withstand typical PWB operating conditions and such that it can more easily withstand the manufacturing processes associated with the fabrication of a PWB. In many instances, the reinforcement layers are constructed from materials with high thermal conductivities, low CTEs and that are relatively less dense. In this way, the reinforcement layers can further the graphene-based thermal management core's thermal management ability without excessively adding weight. Accordingly, in many embodiments, the reinforcement layers are selected so as to provide the constraining core with the desired stiffness, thermal conductivity, CTE, affordability and weight.

The reinforcement layers can be constructed from any suitable material in accordance with embodiments of the invention. In many embodiments, the reinforcement layers can be constructed by impregnating substrate with resin. The resin can be dielectric or non-dielectric. For example, in many embodiments, the resin is one of: an epoxy based resin such as Stablcor® EP-01 manufactured by The Dow Chemical Company, Midland, Mich., a phenolic based resin, a Bismaleimide Triazine (BT) epoxy based resin, a Cyanate Ester based resin, and a polyimide based resin. Of course, it should be appreciated that the reinforcement layers can utilize any suitable resin in accordance with embodiments of the invention. Similarly, the substrate can be any suitable substrate. In many embodiments, the substrate includes carbon products, such as carbon fibers, plates or flakes. In several embodiments, fibrous carbon materials are used as the substrate material. In numerous embodiments the fibrous carbon material is graphite such as CNG-90, CN-80, CN-60, CN-50, YS-90, YS-80, YS-60 and YS-50 manufactured by Nippon Graphite Fiber of Japan, KS3B12, K13C2U, K131C1U, K13A1L manufactured by Mitsubishi Chemical Inc. of Japan, or PAN-based carbon fibers such as A38 3K manufactured by Dow-AKSA of Istanbul, Turkey. Where fibers are used, the fibers may be metal coated (as opposed to non-metallized carbon fibers). In some embodiments, the fibers are non-metallized, e.g. non-metalized carbon fibers. Moreover, the fibers can be arranged in any suitable pattern; for example they may be unidirectional, woven, or non-woven. Woven fibers can be in the form of a plain weave, a twill weave, 2×2 twill, a basket weave, a leno weave, a satin weave, a stitched uniweave, or a 3D weave. It should be understood that the substrate is not limited to including carbon products. E-glass fiber, Kevlar® fiber, and other proper materials can also be used to construct reinforcement layers. Note that dielectric materials can be used in the construction of the substrate. Using dielectric materials to construct the substrate can be especially useful where the graphene thermal management core is configured to be electrically isolated from the electrically conductive layers within the PWB.

In several embodiments, the reinforcement layers can be constructed from carbon fiber/polymer composites that have thermal conductivities over the range from approximately 10 W/mK to 300 W/mK, CTEs from approximately −1 ppm/° C. to approximately 10 ppm/° C., tensile moduli from approximately 3 Msi to 70 Msi, and densities from approximately 1.65 g/cc to approximately 2.5 g/cc. In many instances, carbon fiber/polymer composites manufactured by Stablcor®, such as ST10-Epoxy, ST10 Polyimide and ST325-Epoxy, are implemented. Those Stablcor® materials have thermal conductivities over the range from approximately 75 W/mK to 175 W/mK, CTEs from approximately 2 ppm/C to approximately 7 ppm/C, tensile moduli from approximately 10 Msi to 25 Msi and density from approximately 1.65 g/cc to approximately 1.7 g/cc. Although many materials are listed above, embodiments of the invention are not restricted to the use of the above materials. The reinforcement layers can be constructed from any of a variety of materials appropriate to the requirements of specific applications in accordance with embodiments of the invention.

Figure 2:
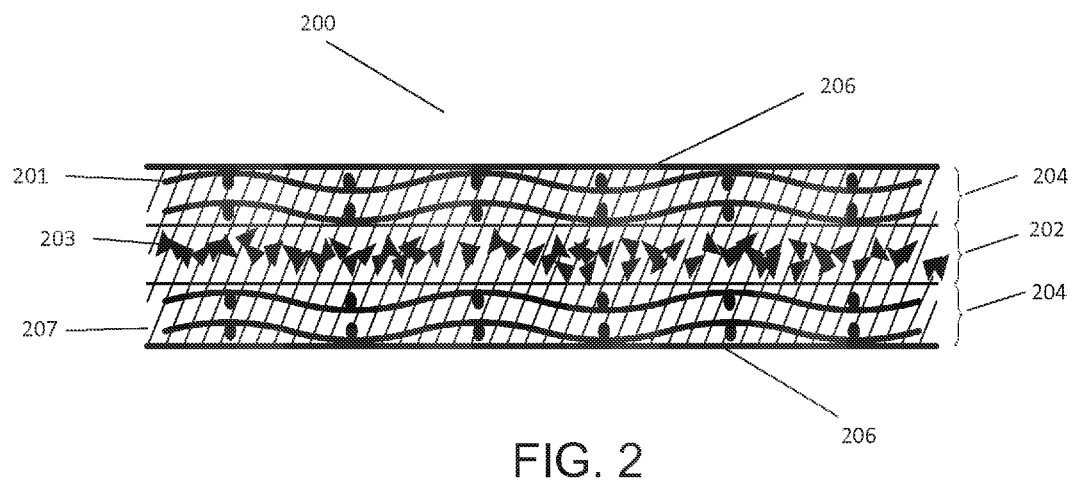
FIG. 2 is a schematic cross-sectional view of a graphene-based thermal management core that includes graphene nanoplatelets in accordance with an embodiment of the invention.

A cross-sectional view of a graphene-based thermal management core including reinforcement layers constructed from carbon fiber reinforced resin in accordance with an embodiment of the invention is illustrated in FIG. 2. In particular, the graphene-based thermal management core 200 includes a layer 202 including a plurality of sheets of graphene 203, disposed in between two reinforcement layers 204 that can be characterized as carbon fiber reinforced resin. More specifically, the carbon fiber 201 adopts a woven pattern. In the illustrated embodiment, the sheets of graphene 203 are in the form of graphene nanoplatelets. It is further illustrated the same type of resin material 207 that is included in the reinforcement layers is used in the casting of the layer 202 that includes the plurality of sheets of graphene 203. Although, in some embodiments, the layers include different resin materials It is also depicted that the graphene-based thermal management core 200 is clad with copper 206 on the top and bottom; the resin 207 can help to bind the copper claddings 206. Where it is desired that the graphene-based thermal management core be electrically conductive, electrically conductive resin can be used. The presence of the cladded copper 206 can facilitate lamination processes that the graphene-based thermal management core 200 may be subjected to, e.g., those lamination processes described below. The copper-cladding may also enhance the electrical conductivity of the graphene-based thermal management core 200. While copper cladding is discussed, it should of course be appreciated that graphene-based thermal management cores can be clad with any electrically conductive material in accordance with embodiments of the invention. The volumetric ratio of the resin can be any suitable ratio appropriate to the requirements of specific applications. In many embodiments, the amount of resin included within the layers in the graphene-based thermal management core is greater than 30% by volume; in some embodiments the amount of resin included within the layers in the graphene-based thermal management core is greater than 40% by volume. In many embodiments, the volumetric ratio of resin varies between the constituent layers of a graphene-based thermal management core. Note that although FIG. 2 depicts that the graphene-based thermal management core includes a layer including at least one sheet of graphene disposed between two reinforcement layers, graphene-based thermal management cores can include any number of reinforcement layers and any number of layers including at least one sheet of graphene in accordance with embodiments of the invention. For example, in some embodiments, a graphene-based thermal management core includes three reinforcement layers and two layers each including at least one sheet of graphene, where the reinforcement layers and the layers including at least one sheet of graphene are in an alternating arrangement.

Figure 3A:
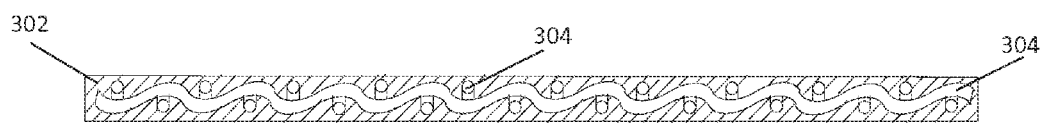
FIGS. 3A-3C are schematic cross-sectional views of various reinforcement layers that can be embedded within graphene-based thermal management cores in accordance with certain embodiments of the invention.
Figure 3B:
Figure 3C:
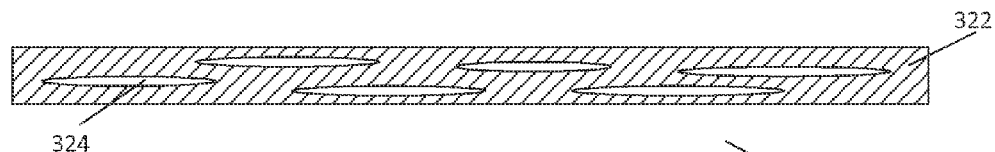

While FIG. 2 depicts reinforcement layers including woven carbon fibers, the substrate material can adopt any suitable structure in accordance with embodiments of the invention. For example, some substrate structures are illustrated in FIGS. 3A-3C. In particular, FIG. 3A depicts a reinforcement layer 300 having a woven fibrous pattern 304 embedded within a resin 302; FIG. 3B depicts a reinforcement layer 310 having a series of continuous fibers 314 in a single general orientation embedded within a resin 312; and FIG. 3C a reinforcement layer 320 having a series of discontinuous short fibers 324 embedded within a resin 322. Of course it should be clear that the reinforcement layers within a graphene-based thermal management core can adopt any suitable structure. For example, in many embodiments, the substrate includes some combination of flakes, nanotubes or other shapes. More generally, the reinforcement layers can be of any suitable material, and are not constrained to being a composite including resin and substrate.

The thickness of each layer in a graphene-based thermal management core can be any suitable thickness to achieve desired electrical properties, thermal management, stiffness, weight and cost. For example, in one embodiment where a graphene-based carbon composite constraining core includes layers including at least one sheet of graphene, Stablcor® and cladded copper, the thickness of the layer including the at least one sheet of graphene is approximately 0.0001 inches (or greater); the thickness of the Stablcor® layers are each approximately 0.002 inches (or greater); and the thickness of each copper layer is approximately 0.007 inches (or greater). In some embodiments, the layer including at least one sheet of graphene has a thickness of between approximately 0.001 inches and 0.010 inches; the thickness of the Stablcor® layers are each between approximately 0.003 inches and 0.009 inches; and the thickness of each copper layer is between approximately 0.0007 inches and 0.0014 inches (corresponding to a range of between 0.5 oz of copper and 1 oz of copper). Of course, as can be appreciated, the thickness of layers within graphene-based thermal management cores can vary widely depending on the materials from which the layers are constructed, the configuration of the core, the application circumstances of the PWB that the core is implemented in and other factors that can influence the design of layer thickness. More generally, layers including at least one sheet of graphene can be used in conjunction with reinforcement layers in any of a variety of ways in accordance with embodiments of the invention. For example, in some embodiments, the layer including the at least one sheet of graphene is not bounded by two reinforcement layers, and is instead disposed adjacent to one reinforcement layer and is clad with copper on an opposing side.

Figure 4:
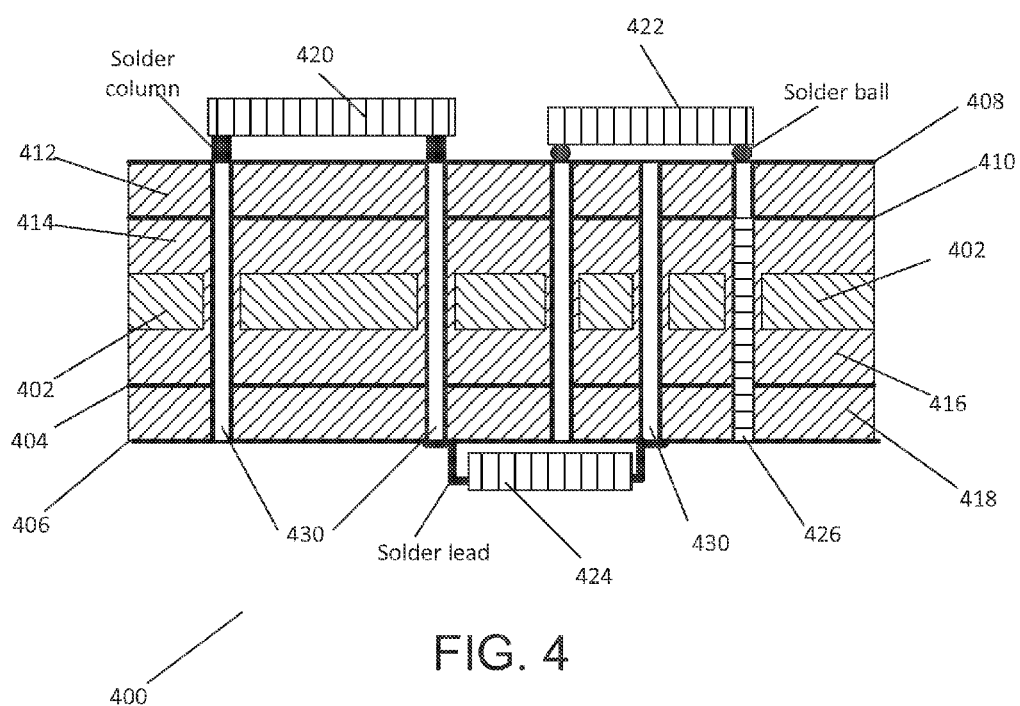
FIG. 4 is a schematic cross-sectional view of a PWB that includes a graphene-based thermal management core that is electrically insulated from the electrically conductive layers within the PWB in accordance with an embodiment of the invention.

Printed Wiring Boards Including Electrically Isolated Graphene-Based Thermal Management Cores While reference has been made to graphene-based thermal management cores being electrically conductive, in a variety of embodiments, graphene-based thermal management cores are implemented within PWBs such that they are electrically insulated from the electrical circuit traces within a PWB. A cross-sectional view of a PWB where its graphene-based thermal management core is insulated from the electrically conductive layers in accordance with an embodiment is illustrated in FIG. 4. The PWB in FIG. 4 is similar to that seen in FIG. 1 except that the PWB 400 includes a graphene-based thermal management core 402 that is electrically insulated from all the electrically conductive layers (404, 406, 408 and 410) due to separation by the dielectric layers (412, 414, 416 and 418). The plated vias 430 are electrically isolated from the constraining core by resin filled clearance holes 432. None of the electronic devices, 420, 422, 424, and 426, that are mounted on the surface of, or embedded within, the PWB 400 is electrically connected to the graphene-based thermal management core 402; instead the circuit paths pass through the graphene-based thermal management core via the resin filled clearance holes 430. Of course, as can be appreciated, where it is not intended that a graphene-based thermal management core be electrically conductive, the reinforcement layers and/or any resin within the graphene-based thermal management core need not be electrically conductive.

As can be appreciated, the configurations of PWBs where graphene-based thermal management cores are not connected to the circuits located on other electrically conductive layers on the PWB are not limited to the illustration in FIG. 4. In some embodiments, for the purpose of furthering heat dissipation, a graphene-based thermal management core can be connected with heat sinks mounted on the surface of the PWB through holes coated with thermally conductive materials. A graphene-based thermal management core in those embodiments does not connect the heat sinks with the circuits located on other electrically conductive layers on the PWB. In general, it is seen how graphene-based thermal management cores may provide effective thermal management capabilities, and may further function to facilitate the operation of mounted electronic components. Processes for manufacturing printed wiring boards including graphene-based thermal management cores are now described below.

Processes for Manufacturing Printed Wiring Boards

While the above-discussion has depicted graphene-based thermal management core configurations and PWBs including such graphene-based thermal management cores, in many embodiments, methods for manufacturing such graphene-based thermal management cores and PWBs that include graphene-based thermal management cores are implemented, and this aspect is discussed in greater detail below. The above-described graphene-based thermal management cores can be fabricated using any suitable technique. For example, in many embodiments, a lamination press can be used to bind the constituent layers of a graphene-based thermal management core. Similarly, the above-described graphene-based thermal management cores are generally compatible with many already-existing printed wiring board fabrication processes. This further increases their utility as they do not require the tailored development of unique fabrication processes in order to be implemented.

Figure 5:
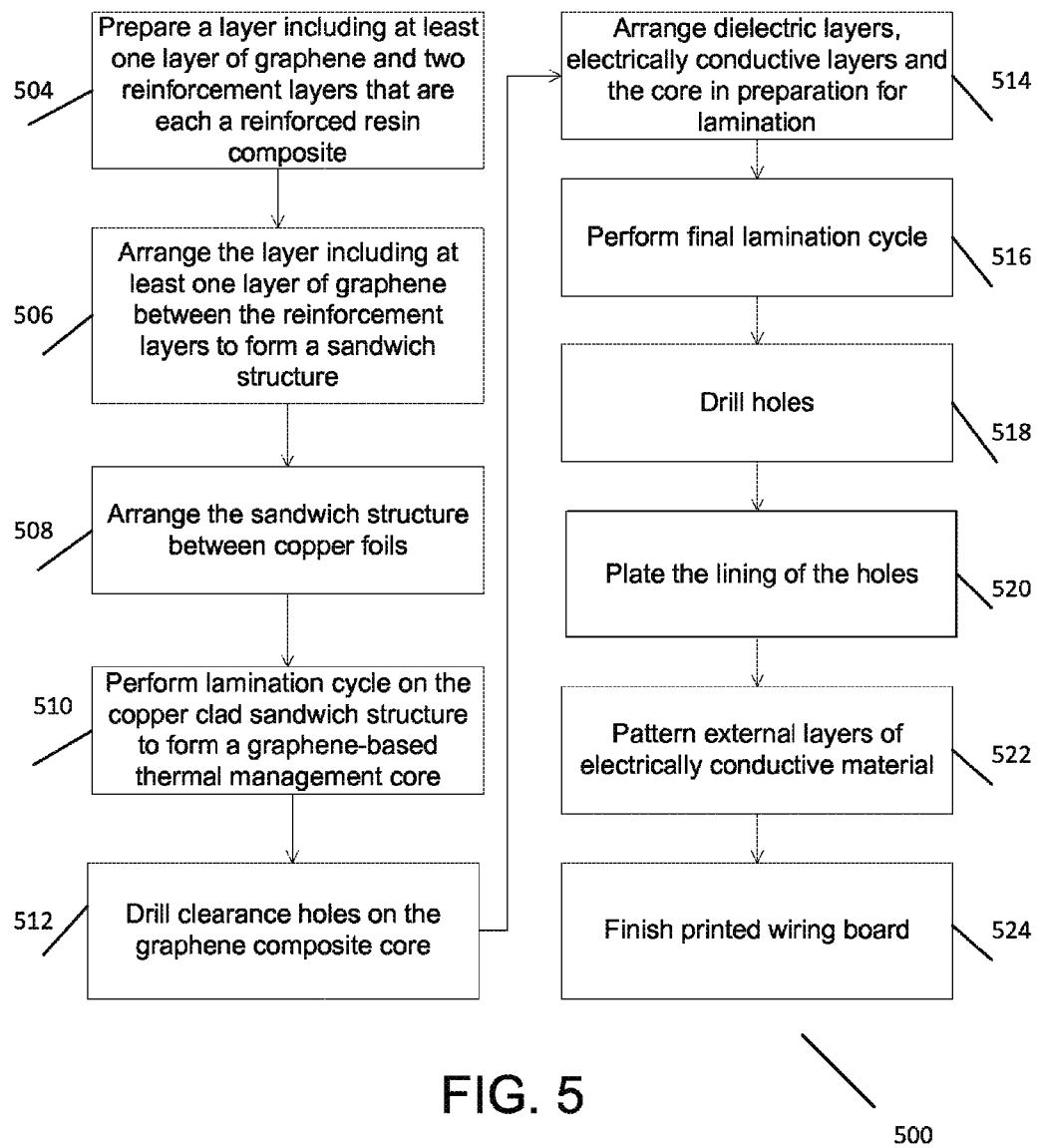
FIG. 5 is a flow chart illustrating a process for manufacturing a PWB that includes a graphene-based thermal management core in accordance with an embodiment of the invention.

For example, a method of manufacturing PWBs that include graphene-based thermal management cores—where the reinforcement layers are reinforced resin composite layers—that uses conventional manufacturing processes is illustrated in FIG. 5. The method shown in FIG. 5 can be used, for example, to construct the PWBs shown in FIGS. 1 and 2. The method 500 includes preparing (504) materials for constructing the reinforcement layers and the layer including at least one sheet of graphene. Preparing (504) these materials can be achieved in any suitable manner. For example, in many embodiments, preparing (504) the materials involves selecting the substrate material and the resin, impregnating the substrate with the resin to construct the reinforcement layers, and semi-curing the resin to B-stage. A B-stage resin is typically a system wherein the reaction between the resin and the curing agent and/or hardener is not complete. The system is thereby in a partially cured stage and can be reheated at elevated temperatures to complete the cross-linking and/or the curing process. The temperatures and conditions to semi-cure the resin are usually recommended by the manufacturers of the resin. Preparing (504) the materials can also include fabricating the layer including the at least one sheet of graphene by immersing graphene nanoplatelets (each of which defining the at least one sheet of graphene) in a resin. Where the layer including the at least one sheet of graphene includes resin, the resin in that layer may also be semi-cured.

In many embodiments, preparing (504) the reinforcement layer includes preparing a reinforcement layer that is clad on one side with an electrically conductive material, e.g. a copper foil. For example, this can be achieved by curing the resin between two copper foils, and then etching one of the copper foils away to create a reinforcement layer that is clad on one side with copper (the unclad side may then bound the layer including the at least one sheet of graphene, for example).

The method 500 can further include arranging (506) the layer including the at least one sheet of graphene between the reinforcement layers to form a sandwich structure (i.e. such that the layer including at least one sheet of graphene is 'sandwiched' by the reinforcement layers). In several embodiments, the method 500 can additionally include arranging (508) the sandwich structure between two copper foils—e.g. where the reinforcement layers are not already clad with electrically conductive material—to form the graphene-based thermal management core stack up. As discussed above, cladding the graphene-based thermal management core with copper can further facilitate its electrical conductivity and its processability. As alluded to above, in some embodiments, the layer including the at least one sheet of graphene can be arranged 506 between two reinforcement layers that are clad on one side with, for example, a copper foil. While the instant method regards a stack up clad with copper, in many embodiments (as can be inferred from above), graphene-based thermal management cores are not clad with copper or any other electrically conductive materials. Correspondingly, in many embodiments, methods for fabricating graphene-based thermal management cores do not include arranging a 'sandwich structure' that is clad with copper foils. Instead, the sandwich structure may be laminated without having any clad copper. More generally, any of a variety of techniques can be used to bind the above-mentioned constituent layers of a graphene-based thermal management core.

The method 500 further includes performing (510) a lamination cycle on the graphene-based thermal management core stack up to produce a graphene-based thermal management core. The parameters for the lamination cycle can be based on the constituent materials within the graphene-based thermal management core stack up. The laminated graphene-based thermal management core can be incorporated within conventional PWB manufacturing processes. Thus, for example, the method 500 can include drilling (512) clearance holes on certain portions of the graphene-based thermal management core. The method 500 can additionally include arranging (514) the graphene-based thermal management core with dielectric layers and electrically conductive layers in preparation for lamination. In many embodiments, the dielectric layers can take the form of clad or unclad prepregs and laminates including resin.

The method further includes performing (516) a lamination cycle to form a PWB subassembly. During lamination, the resin in the dielectric layers can flow under heat to fill the clearance holes. The method can additionally include drilling (518) holes in portions of the PWB subassembly. In many embodiments, drilling (512 and 518) holes can be executed in particular patterns based on whether or not the resulting PWB is intended to have a graphene-based thermal management core that is electrically connected to at least some electrically conductive layers. The process of drilling holes will be described in detail below. Electrically and/or thermally conductive material can be used to plate (520) the lining of the holes. In many embodiments, metals, such as copper, can be used as electrically and/or thermally conductive material. A completed PWB can be formed by patterning (522) the external layer of electrically conductive material of the PWB. The patterning (522) can include printing and etching the PWB assembly. After finishing (524) the PWB, electronic devices can be mounted on the PWB. Although FIG. 5 depicts a method for constructing a PWB including a graphene-based thermal management core, constructing PWBs in accordance with embodiments of the invention is not limited to the methods illustrated in FIG. 5 but can vary depending on for example, the materials, the desired design of the PWB, and/or the application of the PWB.

Figure 6A:
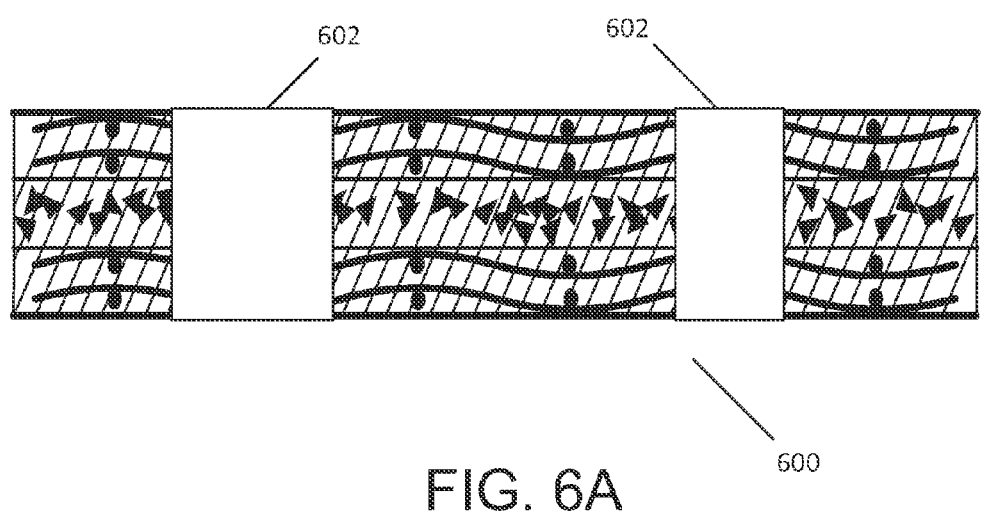
FIGS. 6A-6F are schematic cross-section views of various PWB subassemblies that are constructed as part of the manufacturing process illustrated in FIG. 5.
Figure 6B:
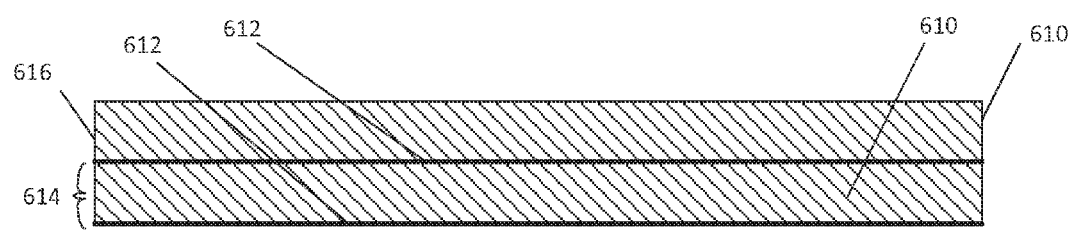
Figure 6C:
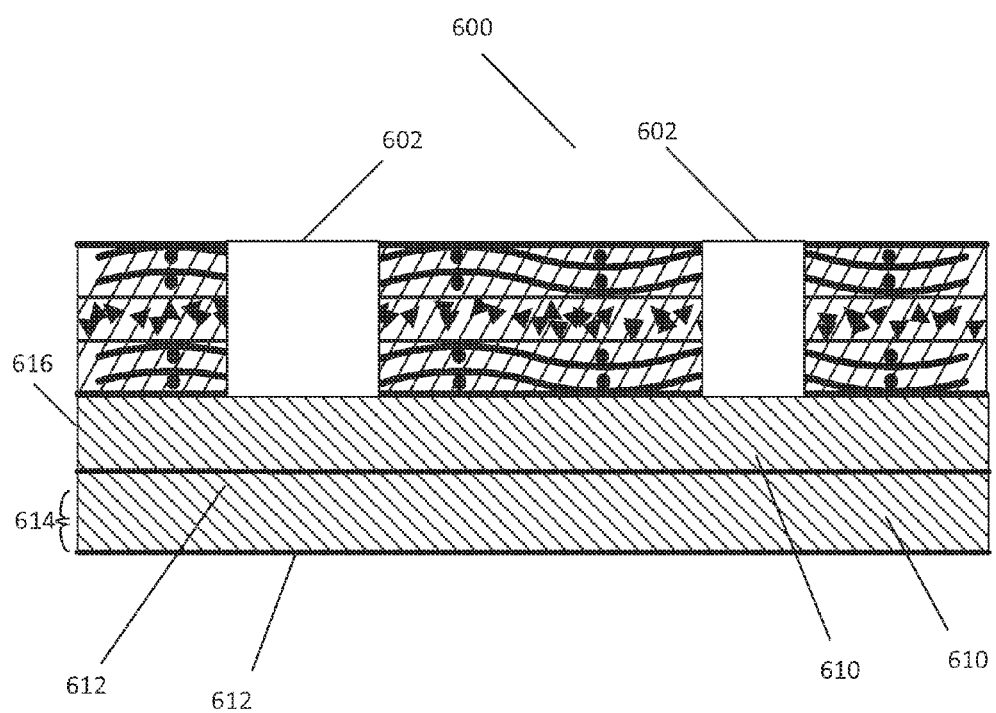

Materials and PWB subassemblies that can be utilized for manufacturing a PWB in accordance with embodiments of the invention are illustrated in FIGS. 6A-6F. Manufacturing a PWB comprising a graphene-based thermal management core in numerous embodiments can include drilling clearance holes. FIG. 6A depicts that clearance holes 602 have been drilled through the graphene-based thermal management core 600. The drilled clearance holes are ultimately filled with resin and can electrically isolate the graphene-based thermal management core from electrically conductive plating of vias drilled through the PWB. Where it is desirable to establish an electrical connection between a circuit on a layer of the PWB and the constraining core, a through hole can be drilled that directly intersects the constraining core (i.e., does not pass through a resin filled clearance hole).

Figure 6D:
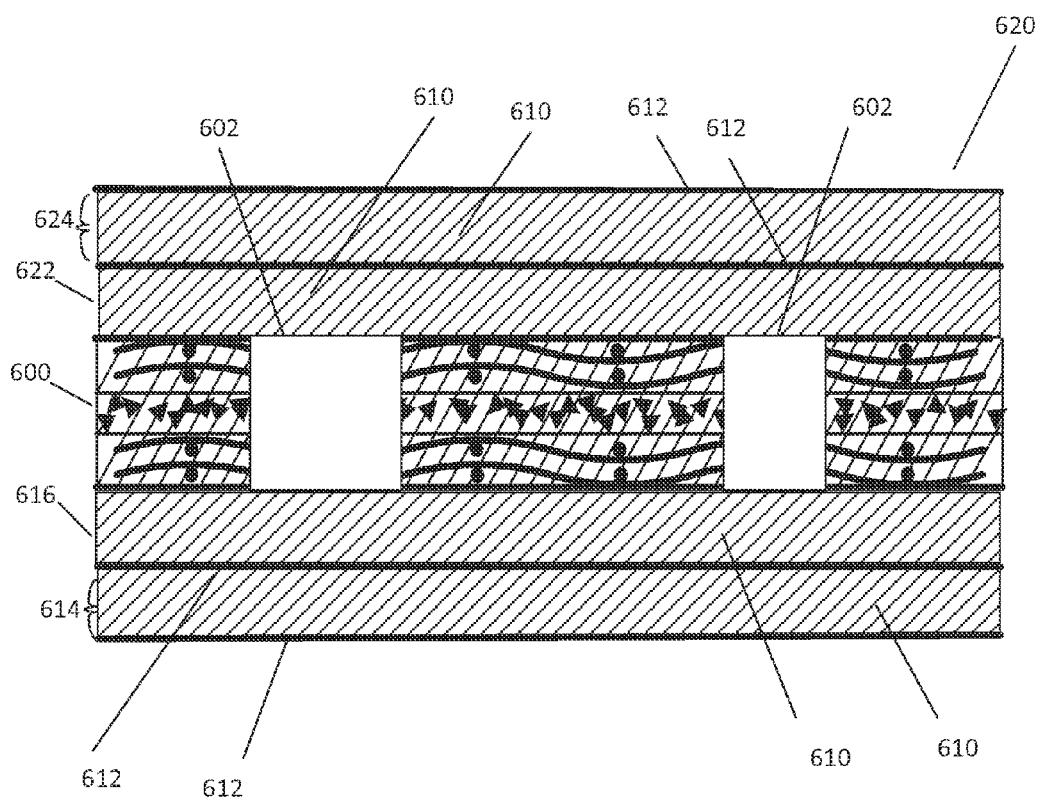

As part of a manufacturing process, the graphene-based thermal management core can be arranged with dielectric layers 610 and electrically conductive layers 612 in preparation for a lamination cycle. This process can be understood with reference to FIGS. 6B-6D. The materials can be arranged by initially taking a laminate 614 clad on both sides with electrically conductive layer 612 and stacking a first prepreg 616 on top of the clad laminate. Typically, the electrically conductive layer adjacent the prepreg is etched with circuit patterns. In the illustrated embodiment, the clad laminate 614 and the first prepreg 616 is manufactured using any of the well know manufacturing techniques employed by those of ordinary skill in art. The graphene-based thermal management core 600 can be put on top of the first prepreg 616. As discussed above, the graphene-based thermal management core 600 can be prepared by drilling clearance holes 602. As shown in FIG. 6D, the arrangement 620 is furthered by placing a second prepreg layer 622 on top of the graphene-based thermal management core 600. A laminate 624 clad on both sides with electrically conductive layers 612 is placed on top of the second prepreg. The electrically conductive layer 612 adjacent the second prepreg 622 can be pre-etched with circuit patterns. The resulting arrangement is illustrated in FIG. 6D. Although the illustrated embodiment includes a prepreg and a laminate above and below the graphene-based thermal management core 600, other embodiments can include more than one patterned clad laminate and/or prepreg on either side of the graphene-based thermal management core in order to form multiple electrically conductive layers. In many embodiments, a PWB is constructed using two prepregs, each clad on one side, that are positioned above and below the graphene-based thermal management core. Many embodiments include multiple graphene-based thermal management cores. For example, some embodiments include two graphene-based thermal management cores separated by a carbon-composite layer (e.g. any of a variety of Stablcor® materials). In many embodiments, a graphene-based thermal management core includes two carbon composite layers separated by a graphene-based thermal management core. As can be appreciated, any of a variety of configurations can be implemented in accordance with many embodiments of the invention.

A second lamination cycle can be then performed. The nature of the lamination cycle is dependent upon the nature of the prepregs and dielectric layers used in the arrangement 620. Manufacturers of resins, prepregs and laminates specify the temperature and pressure conditions that are recommended during lamination. The lamination cycle can be performed adhering to the manufacturer's recommendations for the various materials used in the construction of the PWB.

Figure 6E:
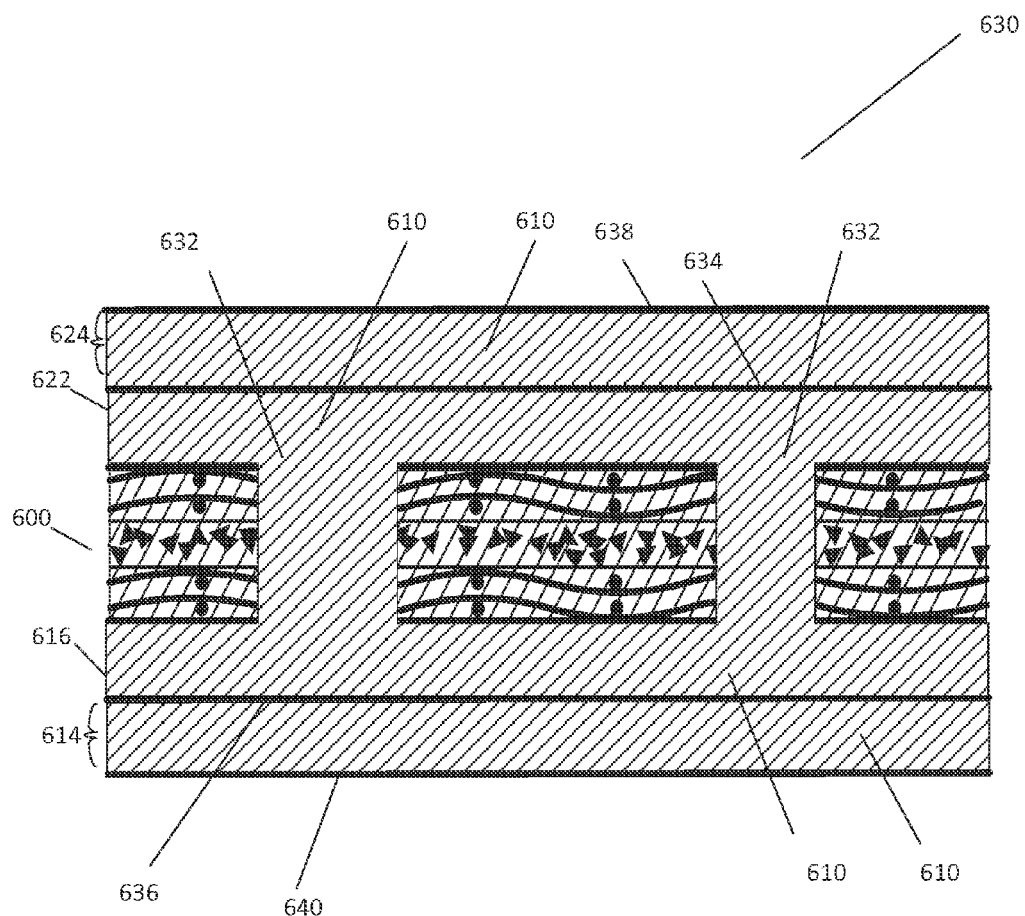

The lamination cycle produces the PWB subassembly 630 in accordance with an embodiment shown in FIG. 6E. As a result of the lamination cycle, resin 632 fills the clearance holes 602 in the graphene-based thermal management core 600 and bonds the electrically conductive layers 634 and 636 to the graphene-based thermal management core 600.

Figure 6F:
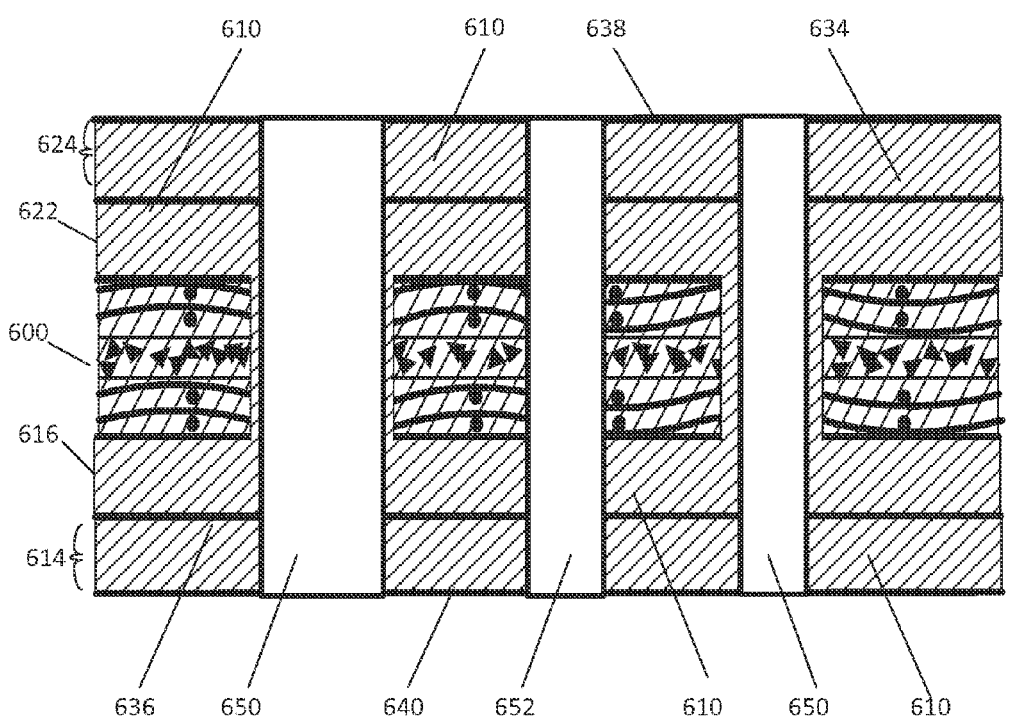

Through holes can be drilled in the PWB subassembly 630. An embodiment of a PWB subassembly with vias drilled through it is shown in FIG. 6F. The PWB subassembly includes a number of vias 650 and 652 that extend through each of the layers of the PWB subassembly. The vias 650 and 652 are plated. Because of the presence of resin between electrically isolated vias 650 and the graphene-based thermal management core 600, the graphene-based thermal management core 600 is insulated from the vias 650 and the electrically conductive layers 634, 636, 638 and 640. The electrically contacting via 652 enables the graphene-based thermal management core 600 to connect with at least one circuit trace on at least one of the electrically conductive layers 634, 636, 638 and 640. As can be appreciated, a via may not extend through all the layers of the PWB subassembly; and a graphene-based thermal management core may not connect with all the electrically conductive layers. In some embodiments where holes through a PWB are only drilled on the spots where clearance holes are drilled, the graphene-based thermal management core is insulated from all electrically conductive layers and does not connect to the circuits located on other electrically conductive layers on the PWB.

The outermost electrically conductive layers of the PWB can be printed and etched. These processes create circuits on and between the layers of the PWB. Electrical circuits within in a PWB can be created between the electrically conductive layers and/or between an electrically conductive layer and the graphene-based thermal management core. For example, plated vials can establish electrical connection between other electrically conductive layers, even when they are electrically isolated from the constraining core. For example, plated vias can pass through resin filled clearance holes that electrically isolate the graphene-based thermal management core to access an opposing side of the graphene-based thermal management core.

Although certain embodiments have been specifically described, it would be understood that additional variations, substitutions and modifications can be made to the system without departing from the scope of the invention. For example, multiple graphene-based thermal management cores similar to the core 200 in FIG. 2 can be included in a single PWB. In general, as can be inferred from the above discussion, the above-mentioned concepts can be implemented in a variety of arrangements in accordance with embodiments of the invention. Accordingly, although the present invention has been described in certain specific aspects, many additional modifications and variations would be apparent to those skilled in the art. It is therefore to be understood that the present invention may be practiced otherwise than specifically described. Thus, embodiments of the present invention should be considered in all respects as illustrative and not restrictive.

What is claimed is:

1. A graphene-based thermal management core comprising:
   a layer including at least one sheet of graphene;
   a first reinforcement layer; and
   a second reinforcement layer;
   wherein the layer including at least one sheet of graphene is disposed between the first reinforcement layer and the second reinforcement layer; and
   wherein at least either the first reinforcement layer or the second reinforcement layer comprises a substrate impregnated with a non-dielectric resin.

2. The graphene-based thermal management core of claim 1, wherein the at least one sheet of graphene is implemented via at least one graphene nanoplatelet.

3. The graphene-based thermal management core of claim 2, wherein the layer including at least one sheet of graphene includes a plurality of graphene nanoplatelets.

4. The graphene-based thermal management core of claim 3, wherein at least two of the plurality of graphene nanoplatelets have a thickness of between approximately 1 nm and approximately 20 nm.

5. The graphene-based thermal management core of claim 4, wherein at least two of the plurality of graphene nanoplatelets have a width between approximately 1 micron and approximately 50 microns.

6. The graphene-based thermal management core of claim 3, wherein at least two of the plurality of graphene nanoplatelets are characterized by a thermal conductivity of between approximately 500 W/mK and approximately 2,500 W/mK.

7. The graphene-based thermal management core of claim 1, wherein at least either the first reinforcement layer or second reinforcement layer comprises a resin that is one of: a phenolic based resin, a Bismaleimide Triazine (BT) epoxy based resin, a Cyanate Ester based resin, and a polyimide based resin.

8. The graphene-based thermal management core of claim 1, wherein the substrate comprises carbon.

9. The graphene-based thermal management core of claim 8, wherein the substrate comprises one of: carbon fibers, carbon plates, carbon flakes, and mixtures thereof.

10. The graphene-based thermal management core of claim 9, wherein the substrate comprises carbon fibers that comprise graphite.

11. The graphene-based thermal management core of claim 10, wherein the carbon fibers are unidirectional.

12. The graphene-based thermal management core of claim 10, wherein the carbon fibers are woven.

13. The graphene-based thermal management core of claim 1, further comprising:
   a first electrically conductive layer bound to the first reinforcement layer; and
   a second electrically conductive layer bound to the second reinforcement layer.

14. The graphene-based thermal management core of claim 13, wherein at least one of the first electrically conductive layer and second electrically conductive layer comprises copper.

15. A printed wiring board comprising:
   a graphene-based thermal management core that itself comprises:
      a layer including at least one sheet of graphene;
      a first reinforcement layer; and
      a second reinforcement layer;
      wherein the layer including at least one sheet of graphene is disposed between the first reinforcement layer and the second reinforcement layer; and
      wherein at least either the first reinforcement layer or the second reinforcement layer comprises a substrate impregnated with a non-dielectric resin;
   at least one dielectric layer; and
   at least one electrically conductive layer that includes a circuit trace;
   wherein at least one dielectric layer is disposed between the graphene-based thermal management core and at least one electrically conductive layer.

16. The printed wiring board of claim 15, wherein the graphene-based thermal management core is electrically isolated from any circuit traces.

17. The printed wiring board of claim 15, wherein the graphene-based thermal management core is electrically connected to at least one circuit trace.

18. The printed wiring board of claim 15, wherein the graphene-based thermal management core is electrically connected to the circuit trace by a via.

19. The printed wiring board of claim 17, wherein the graphene-based thermal management core is configured to act as one of: a ground plane; a power plane; and a split power and ground plane.

20. The printed wiring board of claim 19, wherein the layer including at least one sheet of graphene comprises at least one graphene nanoplatelet.

21. The printed wiring board of claim 20, wherein the substrate comprises carbon.

* * * * *